United States Patent [19]
Chan et al.

[11] Patent Number: 5,635,861
[45] Date of Patent: Jun. 3, 1997

[54] OFF CHIP DRIVER CIRCUIT

[75] Inventors: Francis Chan, Williston; Bijit T. Patel, S. Burlington, both of Vt.

[73] Assignee: International Business Machines Corporation, Armonk, N.Y.

[21] Appl. No.: 671,045

[22] Filed: Jun. 27, 1996

Related U.S. Application Data

[63] Continuation-in-part of Ser. No. 447,479, May 23, 1995, abandoned.

[51] Int. Cl.$^6$ ............ H03K 19/0948; H03K 19/0185
[52] U.S. Cl. .................. 326/81; 326/17; 326/27; 326/86
[58] Field of Search .................. 326/83, 86, 17, 326/27, 57–58, 112, 119, 121, 80–81; 327/544, 534

[56] References Cited

U.S. PATENT DOCUMENTS

| | | | |
|---|---|---|---|
| 4,157,268 | 6/1979 | Bergeron et al. | 148/1.5 |
| 4,296,335 | 10/1981 | Simcoe . | |
| 4,663,701 | 5/1987 | Stotts | 363/60 |
| 4,709,162 | 11/1987 | Braceras et al. . | |
| 4,782,250 | 11/1988 | Adams et al. . | |
| 4,896,057 | 1/1990 | Yang et al. . | |
| 5,004,936 | 4/1991 | Andresen | 326/27 |
| 5,054,001 | 10/1991 | Guillot | 365/226 |
| 5,151,619 | 9/1992 | Austin et al. . | |
| 5,155,392 | 10/1992 | Nogle . | |
| 5,191,555 | 3/1993 | Tobacco et al. | 365/230.08 |
| 5,233,238 | 8/1993 | Mattos . | |
| 5,396,128 | 3/1995 | Dunning et al. | 326/68 |
| 5,406,140 | 4/1995 | Wert et al. | 326/86 |
| 5,418,476 | 5/1995 | Strauss | 326/58 |
| 5,424,659 | 6/1995 | Stephens et al. | 326/81 |
| 5,451,889 | 9/1995 | Heim et al. | 327/534 |

*Primary Examiner*—Edward P. Westin
*Assistant Examiner*—Jon Santamauro
*Attorney, Agent, or Firm*—Susan M. Murray

[57] ABSTRACT

Disclosed is an improved push-pull off-chip driver circuit. The circuit includes a push-pull amplifier including a pull-up transistor and a pull-down transistor, each provided with independent inputs and connected at the output node. The input to the pull-up transistor is provided by a transmission gate having an n-channel transistor connected in parallel with a p-channel transistor. A control transistor is coupled between the output node and the gate of the pull-up transistor to provide a protective bias. A feedback override circuit is coupled between the output node and the gate of the p-channel transmission gate transistor to selectively provide either Vout or a low level potential to that gate. The feedback override circuit improves the response time and noise immunity of a prior art off-chip driver in the active mode in a manner consistent with the objectives of protecting the gate oxides from high voltage stress and prevent leakage currents during the high-impedance mode.

10 Claims, 7 Drawing Sheets

OFF CHIP DRIVER CIRCUIT

The application is a continuation in part of application Ser. No. 08/447,479, filed May 23, 1995 now abandoned.

FIELD

This invention relates to off-chip driver circuits and, more particularly, to CMOS off-chip driver circuits.

BACKGROUND

Present day integrated semiconductor circuits may be designed to operate at one of a variety of power supply voltage levels. In addition to the once-standard 5 V supply, integrated circuits are now commonly designed for lower supply voltages between 3.3 V and 3.6 V, and the push for lower supply levels continues; as geometries have been scaled down to create smaller, denser circuits, lower supply voltages have become necessary to avoid voltage breakdown in the smaller devices. Lower supply voltages have also become desirable for microprocessor circuits in order to minimize power consumption for battery operated portable computers.

Off-chip driver circuits are commonly used to allow such integrated circuits operating at different power supply voltage levels to communicate with each other. Problems encountered by output drivers and addressed by various prior art circuits have included: excessive voltage stress on thin oxide layers of some of the driver devices, and undesirable current leakage paths causing high power dissipation and at times, CMOS latchup problems.

One such prior art driver circuit is taught by U.S. Pat. No. 5,151,619, of common assignee, entitled "CMOS Off Chip Driver Circuit" which is incorporated by reference herein. For convenience, the schematic of the '619 off-chip driver circuit is reproduced in FIG. 1. The prior art circuit operates in an active (driving) mode or a high-impedance (receiving) mode. In the active mode, initiated by causing both inputs to have the same polarity (i.e. both high or both low), the circuit drives either a CMOS low (0 V) to a CMOS high (3.3 to 3.6 V) output voltage transition or a high to low output voltage transition. In the high-impedance mode, initiated by causing one input to be low while the other is high, the driver looks like a high impedance to the next circuit stage which is normally powered by a higher voltage supply (i.e. 5 V). The thrust of the prior art circuit is to protect the transistors within the driver from high oxide gate stress and, when in high impedance mode, to prevent leakage current from flowing from the higher supply voltage (5 V) into Vdd (3.3 to 3.6 V).

While the '619 circuit meets its stated objectives, it has shortcomings which prevent it from being used in higher-speed and lower power applications. The shortcomings, which are discussed in further detail below, are: 1) the operating speed of the driver in active mode is limited by excessive delay in the high-to-low output voltage transition; and 2) a large feedthrough current runs between Vdd and ground in active mode, inducing noise problems and increasing power dissipation.

What is needed is an output driver which maintains the advantages of the prior art driver while improving the response time, noise performance and reducing power dissipation.

OBJECTS OF THE INVENTION

It is an object of the present invention to provide an improved output driver circuit which interfaces between a first circuit with a given supply voltage and a second circuit with a supply voltage having a magnitude greater than that of the given supply voltage without producing excessive voltage stresses on insulation or oxide layers in any of the devices of the circuits, with minimum or no current leakage paths.

It is a further object of the present invention to provide such a circuit with improved response times and with minimum or no feedthrough current, thereby reducing power consumption and delta-I noise.

BRIEF DESCRIPTION OF DRAWINGS

The foregoing and other objects, aspects and advantages will be better understood from the following detailed description with references to the drawings, in which.

SUMMARY

The invention is an improved off-chip driver circuit. The circuit includes first and second input nodes and an output node. A transmission gate is coupled to the first input node for receiving the first input signal and passing it to the gate of a pull-up transistor of a push-pull circuit. The transmission gate includes a p-channel transistor in parallel with an n-channel transistor. The push-pull circuit further includes a pull-down transistor coupled to the pull-up transistor at the output node. A control transistor is coupled between the output node and the gate of the pull-up transistor for providing a protective bias to the pull-up transistor. A feedback override circuit is coupled between the output node and the gate of the p-channel transmission gate transistor. The feedback override circuit selectively provides to the gate of the p-channel transmission gate transistor either a given reference potential or the potential at the output node.

DETAILED DESCRIPTION OF PREFERRED EMBODIMENT

Figure 1:
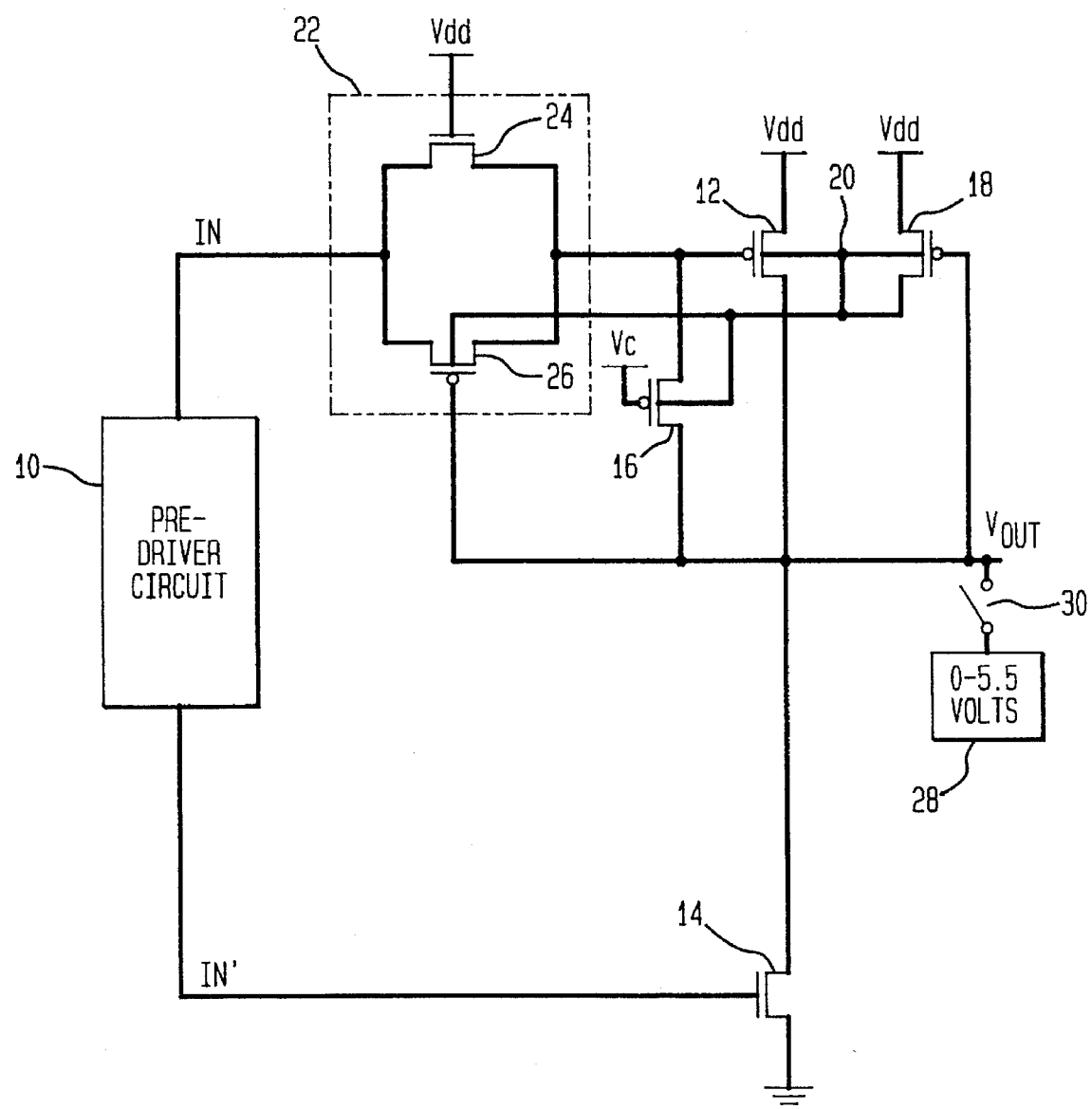
FIG. 1 is a circuit schematic of a prior art off-chip driver circuit.

FIG. 1 is a schematic of a prior art off-chip driver. A detailed description of the circuit and its operation are included in U.S. Pat. No. 5,151,619 which has been incorporated by reference and will be only repeated here to the extent necessary to explain the improvements provided by the present invention. Key elements of the prior art output driver include the transmission gate 22 comprised of p-channel transistor 26 and n-channel transistor 24, the push-pull amplifier comprised of p-channel transistor 12 and n-channel transistor 14, and control transistor 16.

The problem with the prior art driver occurs when it is in the active (driving) mode and making a transition in the output voltage from a HIGH level (3.3 V) to a LOW level (0 V). To drive the output voltage from HIGH to LOW, inputs IN and IN' are both brought HIGH so as to turn off pull-up transistor 12 and to turn on pull-down transistor 14. However, initially, transmission of the signal through transmission gate 22 to pull-up transistor 12 is hampered because the gate voltage of p-channel transistor 26 is initially high (Vout), and only the n-channel transistor 24 is conducting. With only the n-channel transistor 24 conducting, the input voltage at the gate of pull-up transistor 12 only reaches Vdd−|Vtn| and is not adequate to completely shut off pull-up transistor 12, thereby allowing a feedthrough current to flow between Vdd and ground. It is not until the gate of p-channel transistor 26 becomes low and transistor 26 begins to pass the input signal, which is later in the transition, that pull-up transistor 12 finally shuts off. This adds significant delay to the fall time of the driver.

Figure 3:
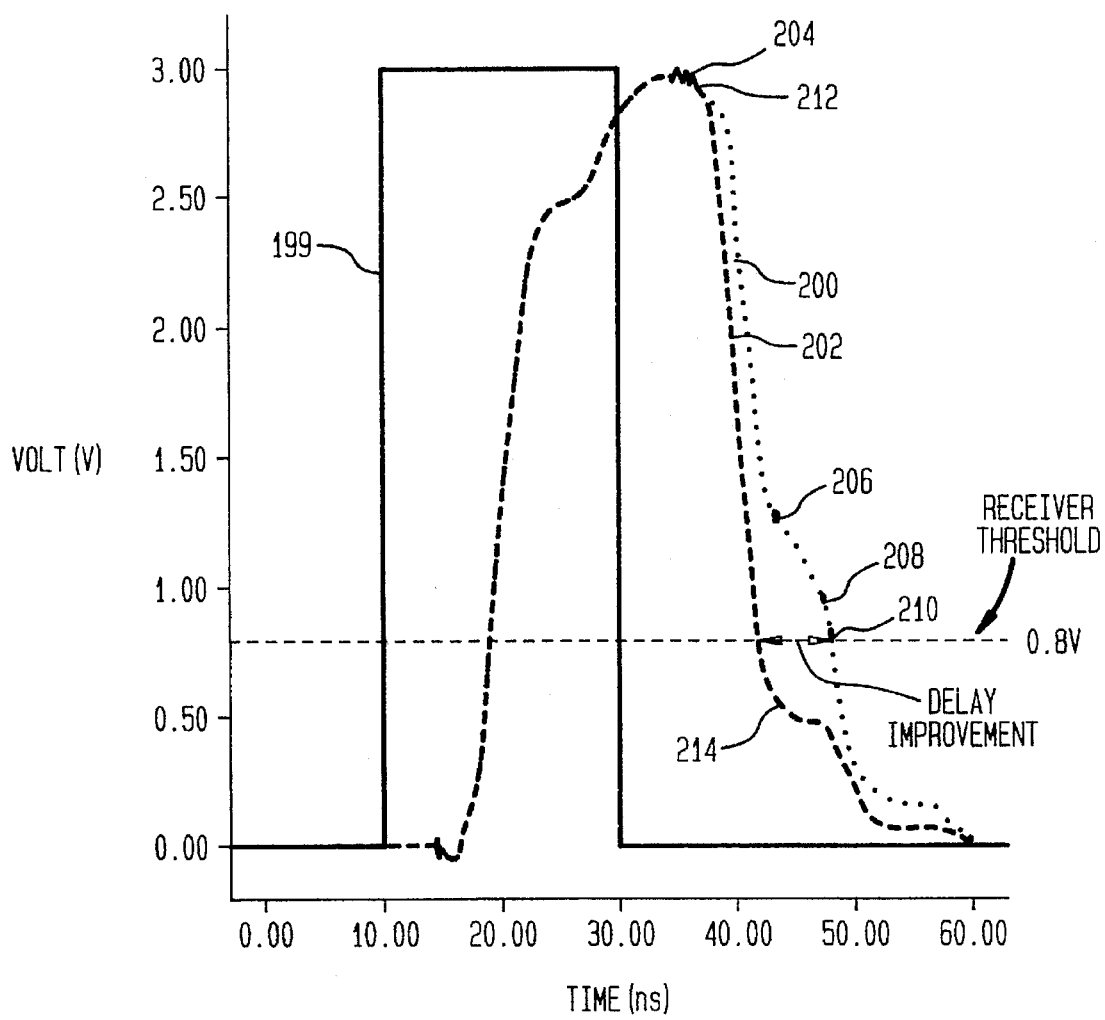
FIG. 3 is a graph showing an exemplary comparison of the output voltage transitions of the present off-chip driver circuit and a prior art off-chip driver circuit for the same input pulse.

FIG. 3 illustrates more clearly, by way of example, the behavior described above. With reference to FIG. 3, trace 199 represents a signal received at inputs IN and IN'. For purposes of convenience of illustration the polarity of the input has been reversed on the graph, but a person skilled in the art would recognize that the prior art circuit inverts the input when in the active mode. Trace 200 represents the potential at the output node, Vout, produced by the prior art circuit when stimulated by the input signal of trace 199. The portion of trace 200 which is of interest is between points 204 and 210 (falling transition). As the transition starts at point 204, the decline is relatively rapid since pull-down transistor 14 is significantly more conductive than is pull-up transistor 12. However, it is slower than it would be if pull-up transistor 12 were not conducting at all. At point 206 the transition stalls because discharge of the transmission line current through transistor 14 to ground is impeded by the feedthrough current, resulting in a diminution of drive capability. It is not until point 208 when the p-channel transistor 26 begins conducting thereby causing the transmission gate to pass a voltage sufficiently high to shut off pull-up transistor 12, that the transition speeds up again.

Figure 4:
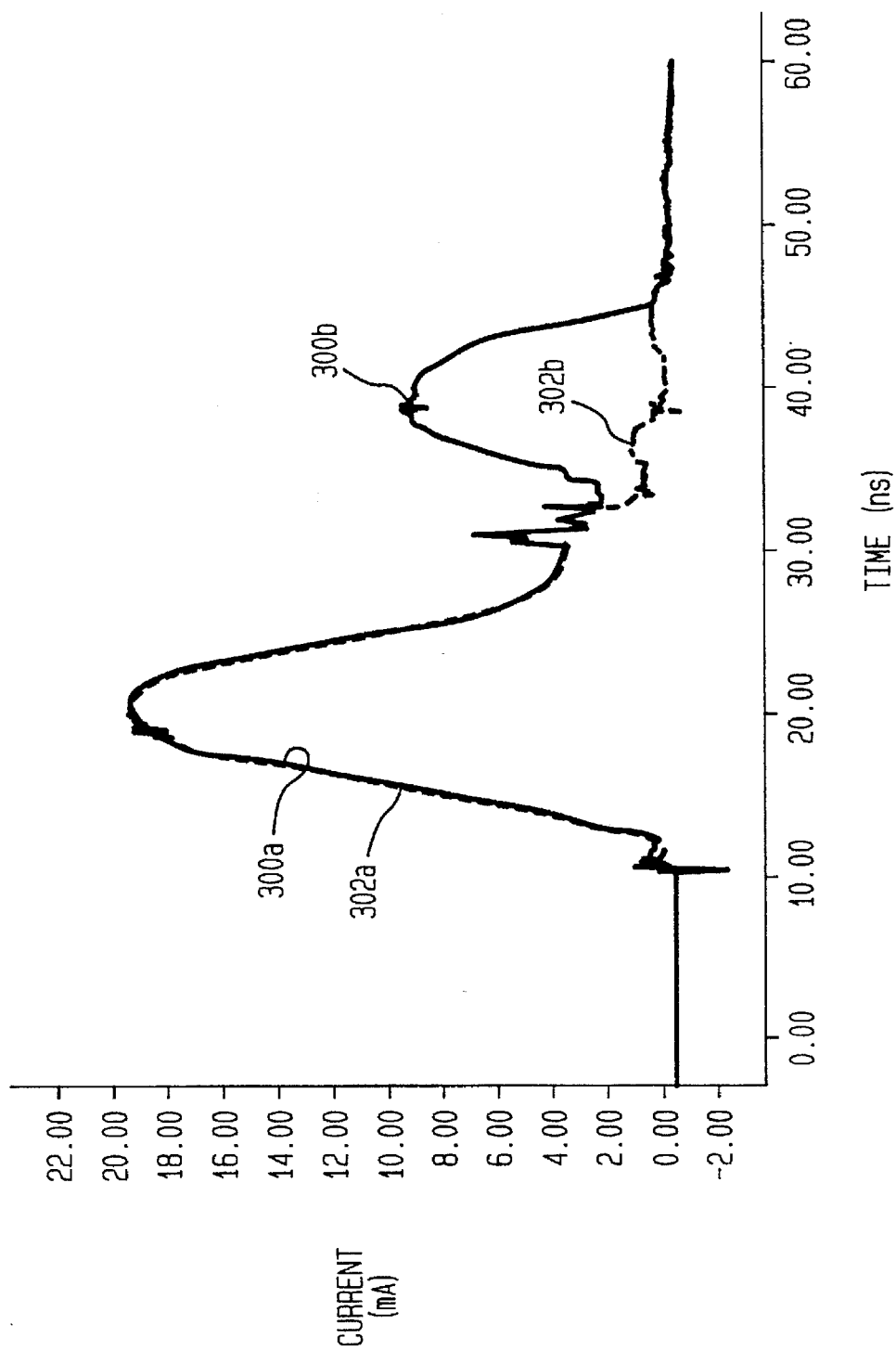
FIG. 4 is a graph showing an exemplary comparison of the Vdd switching current of the present off-chip driver circuit and a prior art off-chip driver circuit.

The large falling transition feedthrough current is illustrated, by way of example, in FIG. 4. FIG. 4 shows the current flowing between Vdd and ground. A first pulse 300a represents the current provided by the prior art circuit to a load when driving a low to high transition at the output node. It is desirable for this current to be relatively high, as is shown in FIG. 4. A second pulse 300b represents the current provided by the prior art circuit when making a high to low transition. It is desirable for this current to be small or nearly zero. Trace 300b, however, has a peak magnitude which is much higher than desired, on the order of 8 mA. This is due to the feedthrough current flowing when both the pull-up transistor 12 and the pull-down transistor 14 are on.

In addition to its deleterious affects on circuit delay the large feedthrough current is undesired because it increases the power dissipation and decreases the noise immunity of the circuit.

The increase in power dissipation is owing to the large magnitude and extended duration of the feedthrough current, as compared with the minimal switching currents normally associated with a conventional push-pull amplifier. This makes the prior art circuit a poor choice for portable computer systems.

The feedthrough current also causes a decrease in noise immunity because it increases the magnitude of the switching current contributing to Delta-I noise. Noise is a disturbance which results in distortion of a signal acted upon by a circuit. Delta-I noise is noise associated with switching currents, particularly rapidly switching currents, which is coupled to other circuits via a ground or power supply of the chip or board on which the driver is located. Parasitic impedances in the substrate or package create a "ground loop" through which noise induced current can flow to other circuits. Delta-I noise is approximately proportional to the magnitude of the difference between the "ON" current and "OFF" current of the switch. The greater the delta the more serious the noise problem. A large feedthrough current in a push-pull type of driver dramatically increases the amount of delta-I noise generated by the driver.

Figure 5:
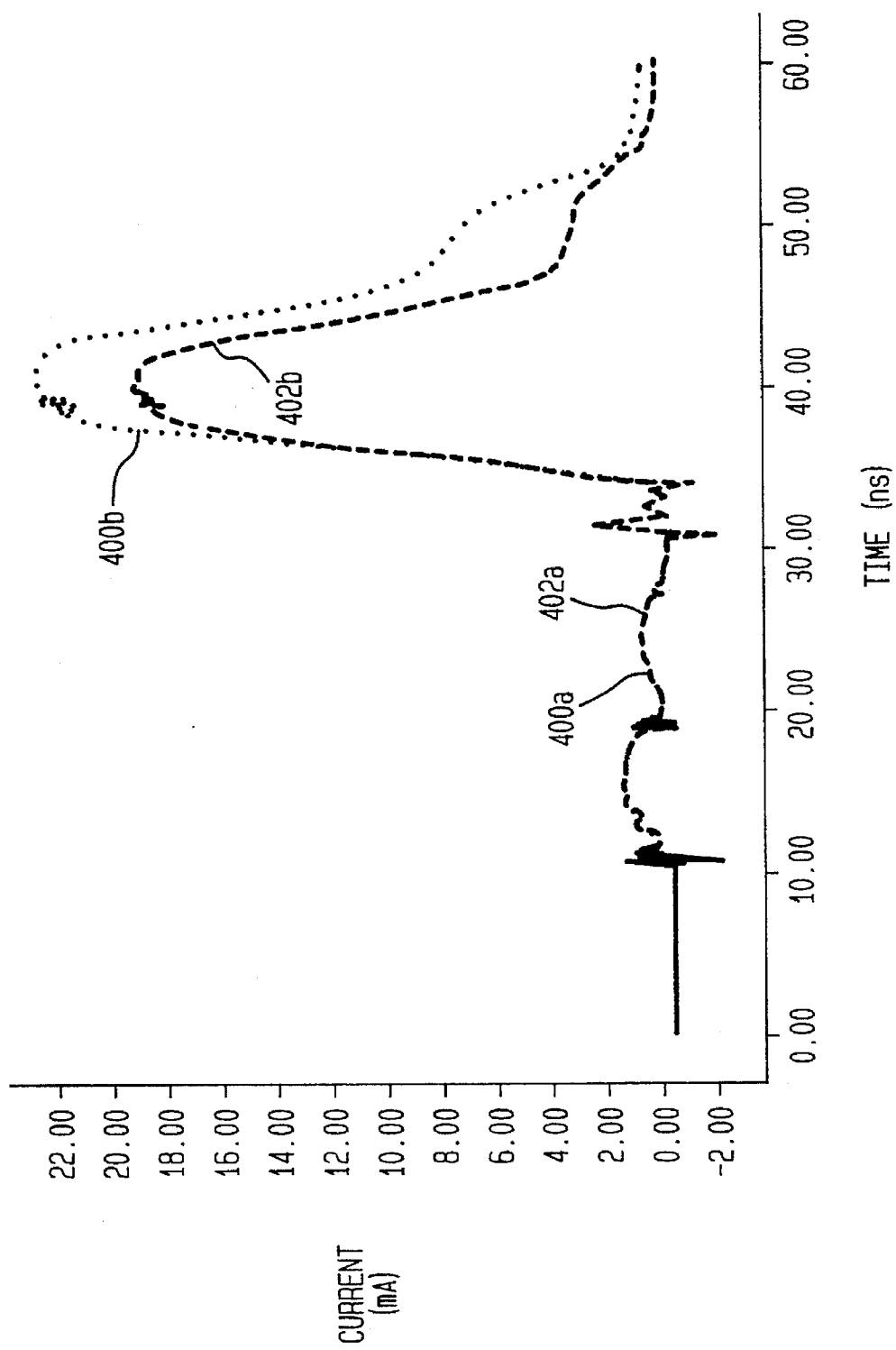
FIG. 5 is a graph showing an exemplary comparison of the ground switching current of the present off-chip driver circuit and a prior art off-chip driver circuit.

With reference to FIG. 5, the ground switching current is shown for the prior art circuit in trace 400, which is divided into a portion 400a associated with the rising output voltage transition and a portion 400b associated with the falling output voltage transition. It is noteworthy that the peak magnitude of the current in pulse b is significantly higher than the driving current observed previously in FIG. 4 with reference to the low to high transition. The lack of symmetry between the two driving currents, which can lead to non-symmetrical output voltage levels, is largely due to the Delta-I noise induced by the high feedthrough current described above with reference to FIG. 4. Non-symmetrical voltage levels results in delay skew and delay penalty.

Figure 2:
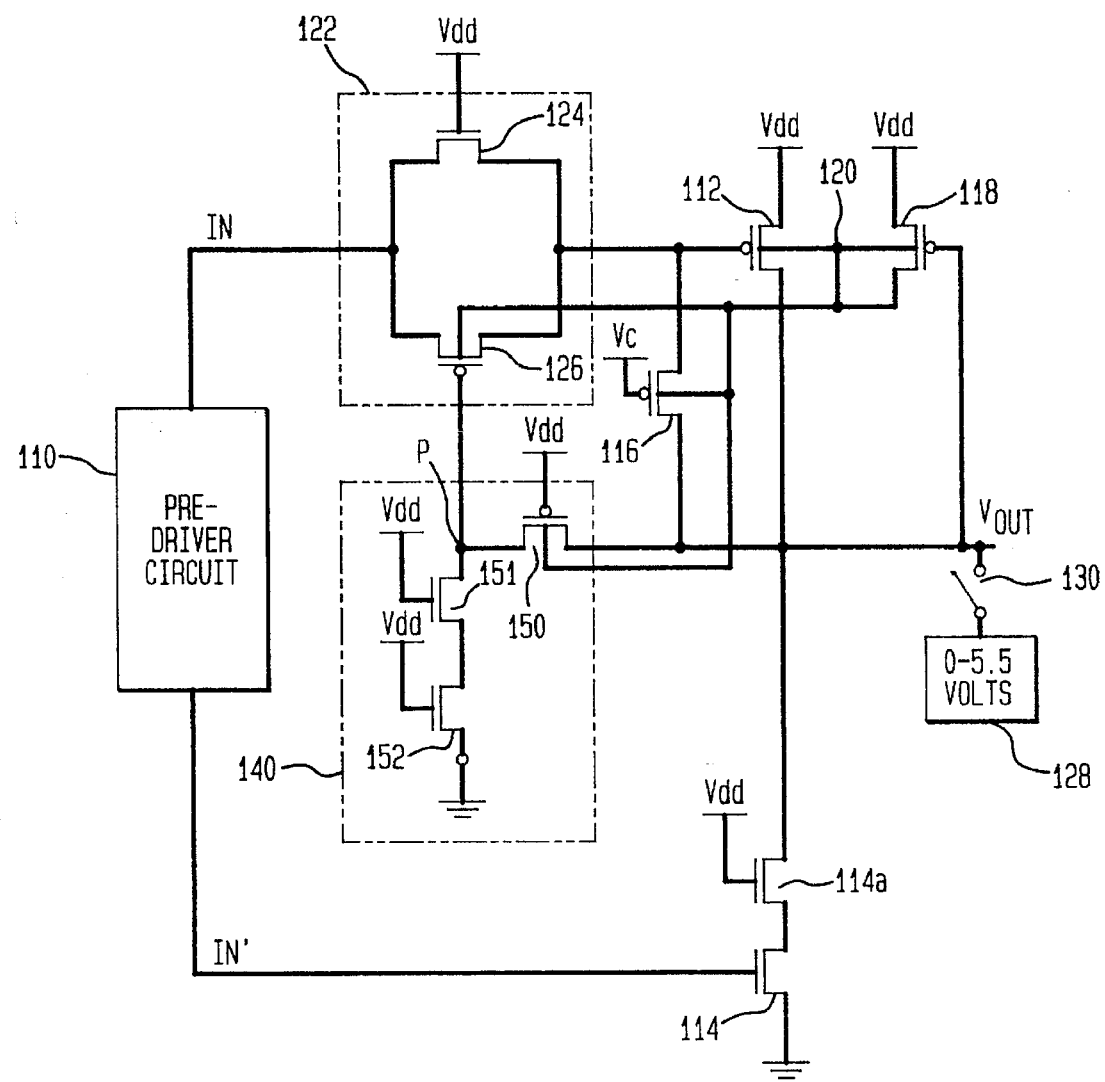
FIG. 2 is a circuit schematic of a preferred embodiment of the present off-chip driver circuit.

The present invention solves the prior art problems noted above while maintaining the ability to protect the transistors incorporated therein from 5 V stress on the gate oxide. Referring to FIG. 2 the preferred embodiment of the present invention is shown. Many of the circuit elements of the present invention are common to the prior art and have been numbered similarly. For example, pass gate transistors 24 and 26 of FIG. 1 correlate to pass gate transistors 124 and 126 of FIG. 2. Pull-up transistor 12 and pull-down transistor 14 of FIG. 1 correlate respectively to pull-up transistor 112 and pull-down transistor 114 of FIG. 2, and so on.

The improvement to the prior art circuit lies in the interposition of feedback override circuit 140 between the drain of control transistor 116 and the gate of p-channel transistor 126. The feedback override circuit 140 is designed to turn p-channel transistor 126 ON when driving an output voltage transition from HIGH to LOW in the active mode without altering the other modes of operation.

More specifically, pass transistor 150, preferably a p-channel field effect transistor disposed in the common N-well 120, has its source connected to Vout and its drain connected to the gate of p-channel transistor 126, while its gate is tied to a reference potential, preferably supply voltage Vdd. Pull-down transistors 151 and 152, preferably n-channel field effect transistors, are stacked and connected between the gate of p-channel transistor 126 and ground. In particular, the source of transistor 152 is connected to ground, the drain of transistor 151 is connected to the gate of transistor 126, and the drain of transistor 152 is connected to the source of transistor 151. The gates of both transistors 151 and 152 are preferably tied to Vdd. While it is possible to remove one of the stacked transistors 151 or 152 and maintain operability, stacking is preferred to avoid punch-through when the voltage at node P is 5 V.

In operation, transistor 150 shields the gate of p-channel transistor 126 from a HIGH output voltage in a HIGH to LOW output voltage transition. At the same time stacked n-channel pull-down transistors 151 and 152 provide a LOW voltage to the gate of p-channel transistor 126. As a result of the LOW gate voltage and the HIGH input voltage on input line IN, p-channel transistor conducts immediately, along with n-channel transistor 124 to rapidly produce a HIGH voltage at the gate of pull-up transistor 112. The HIGH voltage at the gate of pull-up transistor 112 shuts transistor 112 OFF before or at the same time pull-down transistor 114 turns ON, thereby dramatically reducing the magnitude of the feedthrough current.

The feedback override circuit maintains the protection scheme of the circuit when the driver is in high impedance (receiving) mode. When Vout exceeds Vdd by Vtp, transistor 150 becomes a pass gate, transmitting a HIGH level (Vout) to the gate of transistor 126, thereby shutting it OFF and preventing current from flowing into the pre-driver circuit 110. It should also be noted that the present invention maintains the common N-well 120 for the p-channel transistors so as to further avoid leakage currents into power supply Vdd.

An alternative arrangement for feedback override circuit 140 gates the pull-down transistor 152 by an enable signal EN (not shown) rather than by Vdd. During operation in the active mode EN may be brought HIGH so as to make the alternative circuit behave like the circuit of FIG. 2. During operation in the high impedance mode, EN may be brought LOW, turning off transistor 152 and eliminating the current sink created by transistors 151 and 152. In this case, node P is permitted to float and some leakage current may flow between Vdd and the output node through transistor 112 until Vout exceeds Vdd by the threshold voltage (Vtp) of transmission gate p-channel transistor 150.

Transistor 114a, while not critical to the operation of the circuit, is preferably stacked over transistor 114 so as to avoid punch-through when the output voltage is 5 V.

FIGS. 3, 4 and 5, by way of example, illustrate the enhanced performance of the present invention contrasted with the prior art performance. FIG. 3 shows the output voltage transitions for the prior art circuit and the present invention in response to the same input signal. Referring to FIG. 3, trace 200, as discussed above, represents the performance of the prior art circuit. Trace 202 represents the performance of the preferred embodiment of the present invention. A person of ordinary skill in the art would observe that trace 202 shows a significantly faster falling transition between points 212 and 214 such that the receiver threshold voltage (approximately 0.8 V) of the circuit being driven is reached significantly faster. The reduction in delay is attributed to shutting off transistor 12 prior to turning on transistor 14 and represents approximately a 20–25% improvement by the present invention, enabling it to be used in applications running at higher clock speeds than the prior art invention.

FIGS. 4 and 5 show the switching currents of the prior art circuit and the present invention. FIG. 4 shows the switching current flowing from power supply Vdd of the prior art circuit and the present invention. FIG. 5 shows the switching current flowing into the ground node of the prior art circuit and the present invention.

With reference to FIG. 4, traces 300 and 302 represent the Vdd switching current associated respectively with the prior art circuit and the present invention, with the letters "a" and "b" generally indicating the portions of the trace correlating respectively to the rising transition and falling transition. It is desirable that this current be of large magnitude during a low to high transition, so as to drive an output load, and of minimal magnitude during a high to low transition, so as to permit the load to discharge through ground. The prior art circuit exhibits an acceptably large current during the low to high transition as represented by trace 300a, but has an undesirably high current during the high to low transition represented by trace 300b due to the large feedthrough current. In contrast, the improved circuit of the present invention maintains the desired driving current during the rising transition, while nearly eliminating the falling transition feedthrough current.

With reference to FIG. 5, traces 400 and 402 represent the ground switching current associated respectively with the prior art circuit and the present invention, with the letters "a" and "b" generally indicating the portions of the trace correlating respectively to the rising transition and falling transition. It is desirable that this current be of zero or minimal magnitude during a low-to-high transition. For a high-to-low transition, this current should be of similar magnitude relative to the Vdd switching current during a low-to-high transition, so as to drive the output voltage low (0 V). The prior art circuit exhibits an acceptably low current during the low to high transition as represented by trace 300a, but has an undesirably high current during the high to low transition represented by trace 300b due to noise coupled into the ground plane by the large feedthrough current. In contrast, the improved circuit of the present invention maintains the small magnitude current during the rising transition, while restoring symmetry between Vdd low-to-high switching current and the ground high-to-low switching current.

Figure 6:
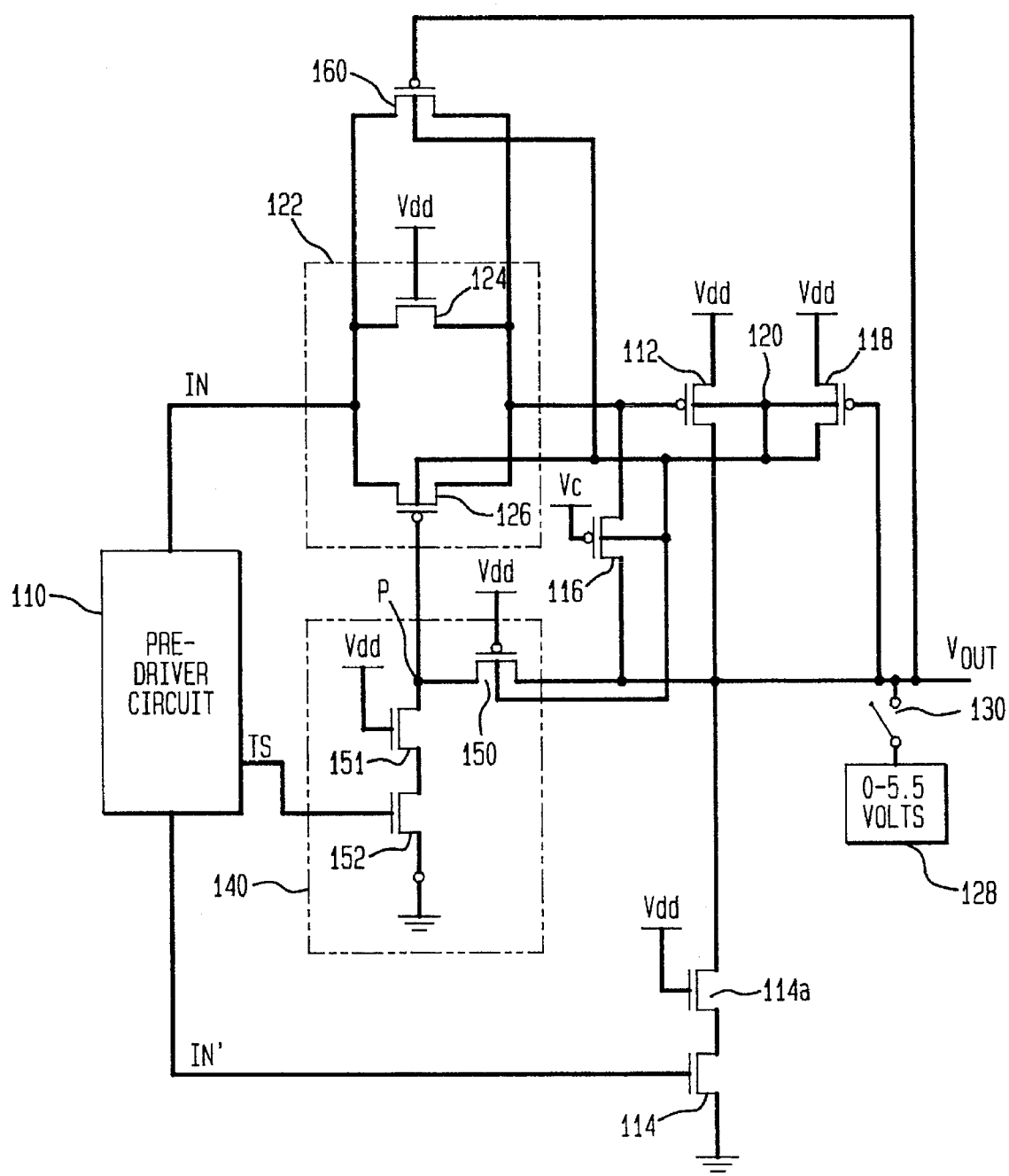
FIG. 6 is a circuit schematic of another embodiment of the present off-chip driver circuit.
Figure 7:
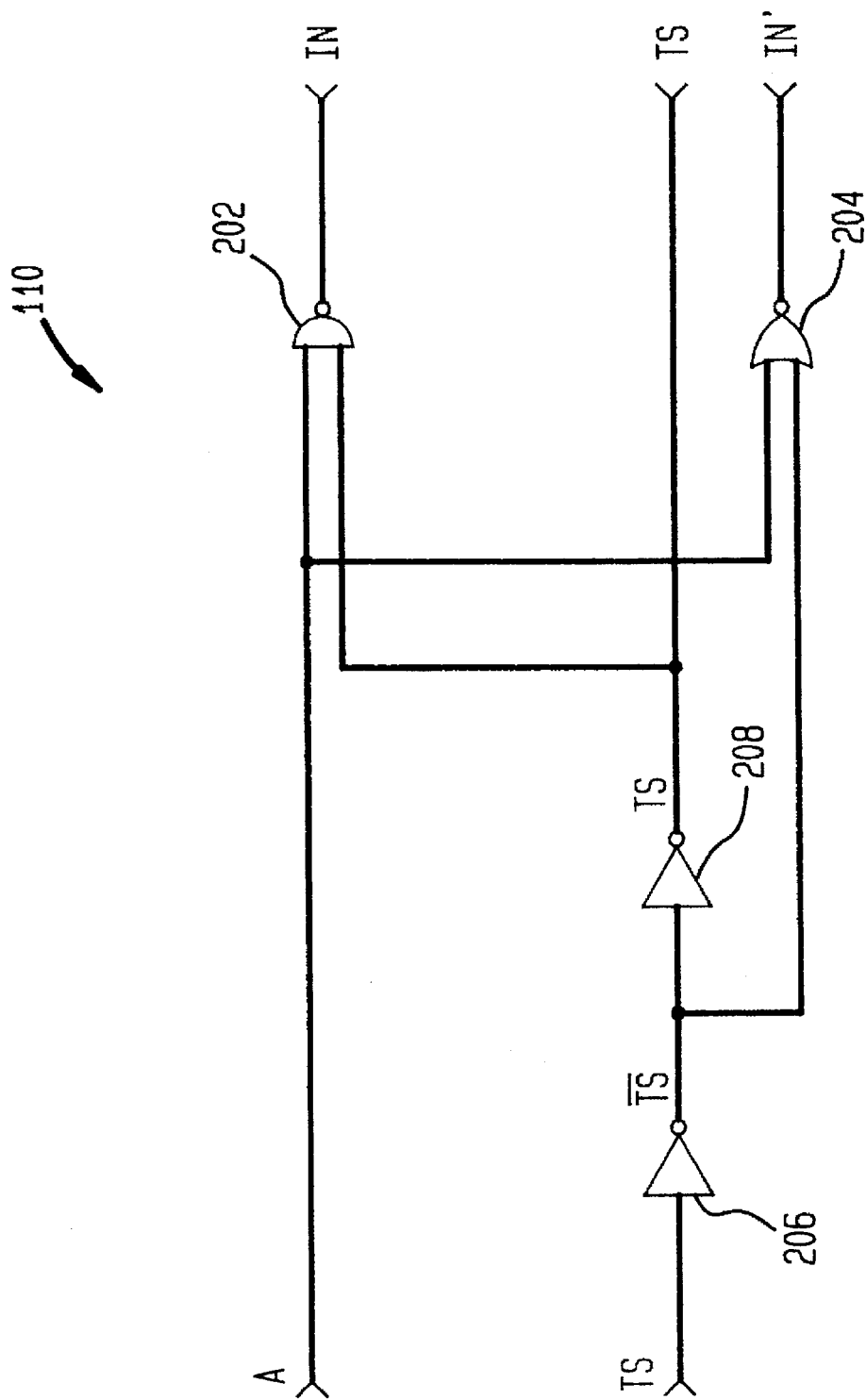
FIG. 7 shows a pre-driver circuit for use with the circuit of FIG. 6.

Further improvements to the driver circuit of the present invention will now be described with reference to FIGS. 2, 6 and 7. FIG. 6 shows an alternate embodiment of the circuit of FIG. 2. FIG. 7 shows a predriver circuit 110 for use with the circuit of FIG. 7. In FIGS. 6 and 7, elements having similar reference numerals to those shown in FIG. 2 have similar functions to those described above with reference to FIG. 2.

With reference to FIG. 2, there may still exist significant transient current leakage paths when the circuit is in high impedance mode. More particularly, for example, when $V_{out}$ is at approximately 4.4 volts during a low to high transition, current may pass through transistor 116 and transistor 126 into the predriver circuit 110 (e.g. due to a resistive divider created by transistor 150 and transistors 151/152 the voltage at node P is large enough to turn on transistor 126 when the gate of transistor 112 is at approximately 4.3 V. Thus, both transistors 116 and 126 conduct and current flows towards predriver circuit 110).

With reference to FIGS. 6 and 7, the circuit may be modified to remove the leakage path through transistors 116 and 126 when $V_{out}$ is greater than or equal to $V_{dd}+V_{tp}$ (or $V_{cc}+V_{tp}$). First, transistor 152 is gated by the tristate control signal TS (e.g. TS is HIGH in active mode; TS is LOW in tri-state or high impedance mode), rather than gated HIGH. When the circuit is in high impedance mode TS is caused to go LOW and transistor 152 is off; with no current path through transistor 150, the voltage at node P will follow the voltage at the output node (e.g. approximately 4.4 V). Since the voltage at the gate of transistor 112 will still be equal to $V_{out}$, the gate to source voltage of transistor 126 is not greater than the threshold voltage of transistor 126, and transistor 126 is not conductive; no current passes into the predriver circuit 110.

With continued reference to FIG. 6, p-type transistor 160 is disposed in the common well 120 along with the other p-type transistors of the circuit and is connected in parallel with transmission gate 122 and is gated by $V_{out}$. By gating transistor 160 with $V_{out}$, transistor 160 is conductive so that when Vout is LOW (e.g. "0") in the high impedance mode, a HIGH voltage is maintained at the gate of transistor 112, thereby insuring that transistor 112 remains non-conductive. (It should be observed that transistor 160 does not adversely affect the active mode of operation, since it follows the output voltage.)

Other arrangements and variations in the circuit disclosed herein maybe used without departing from the spirit and scope of the invention as set forth herein in the following appended claims.

What is claimed is:

1. An off-chip driver circuit comprising:

a first and second input node for receiving a first and second input signal respectively;

an input transmission gate including a p-channel transistor in parallel with an n-channel transistor to receive the first input signal;

a push-pull circuit comprising a pull-up transistor disposed between a voltage supply and an output node and a first pull-down transistor disposed between ground and the output node, the pull-up transistor having a gate electrode for receiving the first input signal provided by the input transmission gate, the pull-down transistor having a gate electrode for receiving the second input signal;

a control transistor coupled between the gate electrode of the pull-up transistor and the output node and having a gate electrode connected to a first given point of reference potential;

a feedback override circuit means coupled between the output node and a gate electrode of the p-channel transistor of the transmission gate for selectively providing to the gate electrode of the p-channel transistor a second given point of reference potential or the potential at the output node; and a biasing transistor, having a gate electrode directly connected to the output node, and coupled to the voltage supply for biasing an N-well in which the pull-up transistor and the control transistor are situated.

2. The off-chip driver circuit of claim 1 wherein the feedback override means comprises:

a pass transistor coupled between the output node and the gate electrode of the p-channel transmission gate transistor, having a gate electrode connected to a third given point of reference potential; and at least a second pull-down transistor coupled between the gate electrode of the p-channel transmission gate transistor and ground and having a gate electrode for receiving an enable signal.

3. The off-chip driver circuit of claim 2 wherein the enable signal comprises a fourth given point of reference potential.

4. The off-chip driver as set forth in claim 2 wherein the first and second pull-down transistors are n-channel field effect transistors.

5. The off-chip driver as set forth in claim 4 wherein the first, second, third and fourth given points of reference potential are substantially the supply voltage.

6. The off-chip driver circuit of claim 2 wherein the at least a second pull down transistor comprises first and second stacked n-channel transistors, the first stacked n-channel transistor having a drain connected to the gate electrode of the p-channel transmission gate transistor and a source connected to a drain of the second stacked n-channel transistor, the second stacked n-channel transistor having a source connected to zero potential, each of the gate electrodes of the first and second stack n-channel transistors connected to a supply voltage potential.

7. The off-chip driver circuit of claim 1 wherein the push pull circuit further includes an additional pull-down transistor, the additional pull-down transistor coupled between the output node and the first pull-down transistor and having a gate electrode connected to the supply voltage potential.

8. An off-chip driver circuit comprising:

a first and second input node for receiving a first and second input signal respectively;

an input transmission gate including a p-channel transistor in parallel with an n-channel transistor to receive the first input signal;

a push-pull circuit comprising a pull-up transistor disposed between a first voltage supply and an output node and a first pull-down transistor disposed between a second voltage supply and the output node, the pull-up transistor having a gate electrode for receiving the first input signal provided by the input transmission gate, the pull-down transistor having a gate electrode for receiving the second input signal;

a control transistor coupled between the gate electrode of the pull-up transistor and the output node and having a gate electrode connected to a first given point of reference potential;

a feedback override circuit means coupled between the output node and a gate electrode of the p-channel transistor of the transmission gate for selectively providing to the gate electrode of the p-channel transistor a second given point of reference potential or the potential at the output node, the feedback override circuit comprising:

a pass transistor coupled between the output node and the gate electrode of the p-channel transmission gate transistor, having a gate electrode connected to a third given point of reference potential; and at least a second pull-down transistor coupled between the gate electrode of the p-channel transmission gate transistor and the second supply voltage and having a gate electrode coupled to a control input signal;

a p-channel transistor connected in parallel with the input transmission gate having a gate electrode coupled to the output node; and a biasing transistor, having a gate electrode directly connected to the output node, and coupled to the first voltage supply for biasing an N-well in which the pull-up transistor, control transistor and pass transistor are situated.

9. The off-chip driver circuit of claim 8 wherein the at least a second pull down transistor comprises first and second stacked n-channel transistors.

10. The off-chip driver circuit of claim 8 wherein the push-pull circuit further includes an additional pull-down transistor, the additional pull-down transistor coupled between the output node and the first pull-down transistor and having a gate electrode connected to the first supply voltage.

* * * * *